(12) United States Patent
Arena et al.

(10) Patent No.: US 8,318,612 B2
(45) Date of Patent: Nov. 27, 2012

(54) METHODS FOR IMPROVING THE QUALITY OF GROUP III-NITRIDE MATERIALS AND STRUCTURES PRODUCED BY THE METHODS

(75) Inventors: Chantal Arena, Mesa, AZ (US); Subhash Mahajan, Tempe, AZ (US)

(73) Assignees: Soitec, Bernin (FR); Arizona Board of Regents for and on behalf of Arizona State University, Scottsdale, AZ (US)

( * ) Notice: Subject to any disclaimer, the term of this patent is extended or adjusted under 35 U.S.C. 154(b) by 139 days.

(21) Appl. No.: 12/937,192

(22) PCT Filed: Nov. 14, 2008

(86) PCT No.: PCT/US2008/083630
§ 371 (c)(1),
(2), (4) Date: Oct. 8, 2010

(87) PCT Pub. No.: WO2009/139793
PCT Pub. Date: Nov. 19, 2009

(65) Prior Publication Data
US 2011/0024747 A1    Feb. 3, 2011

Related U.S. Application Data

(60) Provisional application No. 61/127,721, filed on May 14, 2008.

(51) Int. Cl.
*H01L 21/469* (2006.01)

(52) U.S. Cl. ........ 438/762; 438/758; 438/759; 438/761; 438/765; 438/767; 438/778; 438/779; 257/76; 257/615; 257/E21.097

(58) Field of Classification Search .............. 257/76, 257/615, E21.097; 438/758, 759, 761, 762, 438/765, 767, 778, 779
See application file for complete search history.

(56) References Cited

U.S. PATENT DOCUMENTS

| | | | |
|---|---|---|---|
| 7,091,524 B2 * | 8/2006 | Nakayama et al. | 257/94 |
| 7,364,805 B2 * | 4/2008 | Morita et al. | 428/698 |
| 7,795,630 B2 * | 9/2010 | Nakayama et al. | 257/94 |
| 2002/0069817 A1 | 6/2002 | Mishra et al. | 117/84 |
| 2007/0259504 A1 | 11/2007 | Bour et al. | 438/341 |

FOREIGN PATENT DOCUMENTS

WO    WO 2008/141324 A2    11/2008

OTHER PUBLICATIONS

Heikman et al., "Selective Area Mass Transport Regrowth of Gallium Nitride," Jpn. J. Appl. Phys., 40:565-566 (2001).

(Continued)

*Primary Examiner* — Jay C Kim
(74) *Attorney, Agent, or Firm* — Winston & Strawn LLP

(57) ABSTRACT

The invention provides methods which can be applied during the epitaxial growth of two or more layers of Group III-nitride semiconductor materials so that the qualities of successive layer are successively improved. In preferred embodiments, surface defects interact with a protective layer of a protective material to form amorphous complex regions capable of preventing the further propagation of defects and dislocations. The invention also includes semiconductor structures fabricated by these methods.

17 Claims, 3 Drawing Sheets

OTHER PUBLICATIONS

Hiramatsu et al., "Epitaxial lateral overgrowth techniques used in group III nitride epitaxy," J. Phys.: Condens. Matter, 13:6961-6975 (2001).

Nitta et al., "Mass transport and the reduction of threading dislocation in GaN," Applied Surface Science, 159-160:421-426 (2000).

International Search Report and Written Opinion of the International Searching Authority, application No. PCT/US2008/083630, May 11, 2009.

Tanaka et al., "Anti-Surfactant in III-Nitride Epitaxy—Quantum Dot Formation and Dislocation Termination," Jpn. J. Appl. Phys., 39:L831-L834 (2000).

Zang et al., "Defect reduction by periodic $SiN_x$ interlayers in gallium nitride grown on Si (111)," Journal of Applied Physics, 101:093502-1-093502-4 (2007).

* cited by examiner

METHODS FOR IMPROVING THE QUALITY OF GROUP III-NITRIDE MATERIALS AND STRUCTURES PRODUCED BY THE METHODS

This application is a 371 filing of International Patent Application PCT/US2008/083630 filed Nov. 14, 2008, which claims the benefit of U.S. application No. 61/127,721 filed May 14, 2008.

BACKGROUND

1. Field of the Invention

The invention relates to methods and structures utilized in the fabrication of high quality Group III-nitride materials. Embodiments of the invention are related to methods for improving the surface quality of Group III-nitride semiconductor material. In addition the invention also encompasses structures fabricated utilizing the methods of the invention.

2. Background of the Invention

The quality of a semiconductor material can considerably impact the performance of a solid state device produced from said material. Solid state devices can suffer from inferior lifetimes and operating characteristics when the semiconductor material encompasses an undesirable density of crystal defects, for example dislocations. Monocrystalline semiconductor wafers for device fabrication are commonly sliced from bulk single crystals. However, for certain materials, bulk single crystals are difficult or impossible to grow, and monocrystalline wafers of such materials are often grown epitaxially on suitable substrates. A suitable substrate is one that closely matches the crystal properties of the target material to be grown; if these properties do not closely match, the resulting material usually has an unacceptable density of defects and dislocations.

It has turned out in practice that, for semiconductor materials such as gallium nitride (GaN), other Group III-nitrides (e.g., AlN, InN, GaInN) and other mixed nitrides (referred to herein as "Group III-nitrides"), neither bulk single crystals nor suitable substrates are available. In the case of GaN, crystal quality can be improved to some extent by pre-treatment of the growth substrates, e.g., by nitridization and other chemical modifications; by growing thin, low temperature buffer layers of other Group III-nitrides, e.g., AlN or GaN, by thermal annealing, and the like.

Also GaN growth methods such as epitaxial lateral overgrowth (ELO) and its variants (PENDEO, FIELO, etc) have proven successful in reducing defect density. However these methods often produce materials with a highly non-uniform distribution of surface defects, undesirable in many device applications. Newer growth methods of limiting defect number and improving their surface homogeneity have utilized in-situ (or ex-situ) deposition methods to impede dislocation progression in some instances along with the optional addition of etchants to enhance surface defect dimensions. See, e.g. Applied Materials US2007/0259504, Tanaka et al. Japanese Journal of Applied Physics 39 L831 2000 and Zang et al. Journal of Applied Physics 101 093502 2007).

Accordingly, in the past wafers of Group III-materials have had limited availability along with insufficient quality to serve either as substrates for fabrication of reliable devices or as substrates for growth of further Group III-nitride materials. Clearly, layers and crystals of Group III-nitrides of improved quality are desirable, but widely applicable processes for doing so are not commonly known in the prior art.

SUMMARY OF THE INVENTION

The present invention generally provides systems and methods for fabricating Group III-nitride structures with surface layers of improved qualities, e.g. with fewer dislocations. The invention also encompasses Group III-nitride structures fabricated utilizing said systems and methods. The methods are now briefly described in terms of certain preferred but non-limiting embodiments of the invention.

In more detail, one preferred embodiment of the invention provides methods for growing a following layer of a Group III-nitride material over an initial layer of a Group III-nitride material that includes a plurality of surface emergent defects. One such method selectively forms localized regions of an amorphous complex material at the surface of the initial Group III-nitride semiconductor layer, and then overgrows the surface of the initial layer (which also includes a plurality of surface emergent defects) with the regions of amorphous complex material with a following Group III-nitride semiconductor layer under conditions favoring epitaxially laterally overgrowth ("ELO"). Another such embodiment reduces defects and dislocations during the fabrication of a final Group III-nitride layer by first providing an initial Group III-nitride with a plurality of surface emergent defects, then selectively forming regions of amorphous complex material in the initial Group III-nitride semiconductor layer, and finally epitaxially overgrowing the regions of amorphous complex material with a following Group III-nitride semiconductor layer.

Preferably, the regions of amorphous complex material are formed located at or proximate to some or all of the surface emergent defects and include materials that substantially prevent the nucleation of the following Group III-nitride semiconductor material thereon. Also preferably, the regions of amorphous complex material preferably substantially prevent the propagation of defects and dislocations from the initial Group III-nitride semiconductor layer into the following Group III-nitride semiconductor layer so that the following Group III-nitride semiconductor layer thereby has a lower surface defect density then the initial Group III-nitride semiconductor layer.

In particular aspects, these methods preferably form the regions of amorphous complex material by occluding a plurality of the surface defects with a protective layer of protective material, and then by thermally treating, preferably at a temperature of at least 600° C., the initial Group III-nitride semiconductor layer with the protective layer of protective material thereon. The protective layer preferably substantially prevents decomposition of the initial Group III-nitride semiconductor surface during the thermal treatment.

Another preferred embodiment provides methods for preventing the propagation of surface emergent defects from an initial Group III-nitride layer into subsequent and overlying Group III-nitride layer. These methods first deposit a layer of protective material upon the initial Group III-nitride layer, then promote a selective interaction between the plurality of surface emergent defects and the protective layer, then remove the protective layer, and finally epitaxially deposit a following layer of Group III-nitride material.

In particular aspects, these methods preferably promote the selective interaction between the plurality of surface emergent defects and the protective layer by performing a thermal process, and then remove the protective layer by performing a chemical mechanical polishing process or a plasma etching process, and further after protective layer removal, optionally perform an smoothing process performed. Preferably, the protective layer comprises an amorphous material.

These methods can be repeated one or more time so that successive following Group III-nitride layers have reduced surface defect densities in comparison to the underlying Group III-nitride layers. In particular, the steps of depositing a following protective layer, promoting the selective interaction between the following protective layer and the surface defects of the underlying Group III-nitride film, the removal of the protective layer, and the deposition of the successive following layer can be repeated one or more times.

Preferred embodiments of the invention also include semiconductor structures. One such structure includes a lower Group III-nitride semiconductor layer including amorphous complex regions located at or proximate to emergences of defects and dislocations at an upper surface of the lower layer, and an upper Group III-nitride semiconductor layer overlying the lower Group III-nitride semiconductor layer so that a lower surface of the upper layer is adjacent to the upper surface of the lower layer. Aspects of these embodiments include structures wherein the upper layer of Group III-nitride semiconductor material has a surface defect density less than the adjacent lower Group III-nitride semiconductor surface, wherein the amorphous complex regions include one or more of silicon, nitrogen, and a Group III metal.

Aspects of these embodiments include structures with three or more layers, in particular a structure with one or more additional Group III-nitride semiconductor layers, each additional layer having an upper surface including amorphous complex regions located at or proximate to the emergences of defects and dislocations at the upper surface, and each additional layer overlying a respective lower Group III-nitride layer so that a lower surface of the additional layer is adjacent to an upper surface of the respective lower Group III-nitride semiconductor layer. Further, successive following Group III-nitride semiconductor layers preferably include amorphous complex regions adjacent to one another.

The term "substantially" is used herein to refer to a result that is complete except for deficiencies no greater than what are normally expected in the art. For example, an epitaxial layer cannot routinely be expected to be completely continuous (or completely monocrystalline, or completely of one crystal polarity) across macroscopic dimensions. However, an epitaxial layer can routinely be expected to be "substantially continuous" (or "substantially monocrystalline", or "substantially of one crystal polarity") across macroscopic dimensions where the discontinuities (or crystal domains, or crystal boundaries) present are those expected in the art for the processing conditions, the material quality sought, intended use, or so forth.

Similarly, a semiconductor layer having "substantially no defects and dislocations" is used herein to mean that the semiconductor layer has a density of defects and dislocations that is at least low or a very low in comparison to what is common in the art for the material of the semiconductor layer. For example, in the case of GaN, "substantially no defects and dislocations" (or a low or very low density of defects or dislocations) is taken to refer to herein to defect or dislocation densities of less than approximately on the order of $10^5/cm^2$ to $10^6/cm^2$, and especially less than approximately on the order of $10^5/cm^2$. The defect density in the Group III nitrides is measured by methods well know to those familiar in the art, including, atomic force microscopy, optical microscopy, scanning electron microscopy and transmission electron microscopy. The preferred method for measuring the defect density is by transmission electron microscopy (TEM).

The term "amorphous" is used to describe a material in which there is no substantial long range order in the positioning of its constituent atoms. This is opposed to a crystalline material wherein there is a high degree of long range order of the constituent atoms. It is understood in the art that within an amorphous material it is common to find regions with limited short term order or short term crystallinity (e.g. over a few atomic or molecular spacings), however it is also understood that such regions of short term order with an otherwise amorphous material do not constitute an ordered material.

In addition, the term "amorphous complex" is used to describe an amorphous reaction product formed between an amorphous material and a semiconductor material, especially herein a Group III-nitride semiconductor material. Such an amorphous complex comprises reaction products produced from the interaction between an amorphous layer and a Group III-nitride material component and is without substantial long range order.

Headings are used herein for clarity only and without any intended limitation. A number of references are cited herein, the entire disclosures of which are incorporated herein, in their entirety, by reference for all purposes. Further, none of the cited references, regardless of how characterized above, is admitted as prior to the invention of the subject matter claimed herein. Further aspects and details and alternate combinations of the elements of this invention will be apparent from the following detailed description and are also within the scope of the inventor's invention.

BRIEF DESCRIPTION OF THE DRAWINGS

The present invention may be more fully understood by reference to the following detailed description of the embodiments of the invention, illustrative examples of specific embodiments of the invention and the appended figures in which.

DETAIL DESCRIPTION OF EMBODIMENTS OF THE INVENTION

Figure 1A:
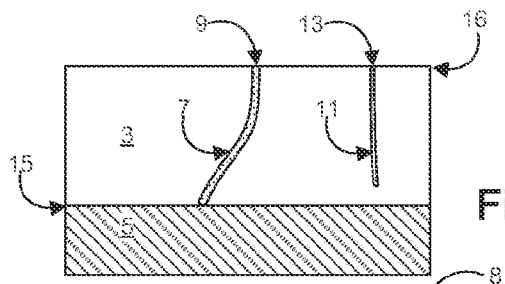
FIGS. 1 A-E schematically illustrate a specific embodiment of the invention.

The embodiments of this invention prevent defects, e.g. dislocations, that are present at an earlier stage of epitaxial growth of a Group III-nitride layer from being present at a following stage, so that the following epitaxial Group III-nitride layer can have improved quality. These methods can be performed once to improve the quality of the following layer, or can be performed two or more times to successively improve the quality of successive following layers. In the subsequent text, the terms "defect" and "dislocation" are used generally to refer to localized regions of disordered crystal structure regardless of their precise crystallographic description.

Generally, one of the principals of the invention is that a protective layer (comprising protective material), when placed on a surface of an initial Group III-nitride layer under appropriate conditions, will selectively interact with all, or substantially all, of the surface emergent defects present at the surface of an initial Group III-nitride layer thereby primarily forming amorphous complex regions at such surface emergences. These amorphous complex regions prevent the propagation of the defects and dislocations from the bulk of initial Group III-nitride layer to a subsequent following layer of Group III-nitride material, because the following layer is grown initially above and over the amorphous complex regions by epitaxial lateral overgrowth (ELO). In preferred embodiments, the material of the following Group III-nitride layer is substantially the same as, or has crystal properties closely similar to, the material of the initial Group III-nitride layer, so that the portions of the interface where the materials of these layers come into direct contact will induce few or no defects or dislocations in the following layer. Thereby, in preferred embodiments, the following layer has improved quality in that it has fewer defects and dislocations than are present at the initial surface.

In somewhat more detail, methods of the invention form regions of amorphous complex material (amorphous complex regions, amorphized complex material, etc.) on the surface of an initial Group III-nitride, which is, except for the surface emergence of defects or dislocations, preferably a substantially mono- (or poly-) crystalline semiconductor layer. Amorphous complex regions (i.e. regions without substantial long range order) are formed locally in the vicinity of, or proximate to, the surface emergences of preferably substantially all, or at least the great majority of, crystalline defects and dislocations within the Group III-nitride material. On the other hand, crystalline areas (areas with longer range order) away from such surface emergences are free, or substantially free, of amorphous complex material. Alternatively stated, the methods of the invention are designed to convert all, or at least substantially all, of the surface area of each individual one or substantially all, or at least the great majority of, the surface emergences of crystalline defects and dislocations, while leaving crystalline regions undisturbed. The resulting amorphous complex regions thus preferably occupy the entire surface area of the emergences (possibly also extending along the surface somewhat beyond the surface emergences) and extend in depth along the defect or dislocation for a corresponding distance. Thus, the amorphous complex regions are said herein to "occlude" surface emergences of defects or dislocation. However, the surface extent of the amorphous complex regions is limited so that preferably no more than about 50% (and preferably much less) of the total surface area of the initial Group III layer in order not to hinder subsequent lateral epitaxial growth.

For example, in a GaN layer, defects or dislocations in the bulk material can have a surface emergence extending laterally for up to about 300 lattice constants. Since a GaN lattice constant is about 3 Å, if the surface density of defect or dislocation emergences in the initial GaN layer is about $5 \times 10^8$ cm$^2$, then about at most 3-5% of this initial layer will be occupied by the amorphous complex regions, and if the surface density of defect or dislocation emergences in the initial Group III-nitride layer is approximately $5 \times 10^9$ cm$^2$ or less, then about at most 30-50% of the surface will be occupied by amorphous complex regions.

Preferred embodiments of the invention are now described with reference to FIGS. 1A-E. The figures schematically illustrate the principal aspects of the steps of this invention and illustrate, but are not intended to be fully accurate, technical representations. Thus, known physical structures of an epilayer or its surface are not illustrated if they are not relevant or useful to illustrating this invention. In particular, one of average skill would understand, that natural irregularities often occur in the vicinity of the surface emergence of a defect or dislocation. However, these irregularities and other similar effects are not illustrated as they are believed not to be particularly relevant to the principal aspects of the steps of this invention and are therefore not illustrated.

Figure 1B:
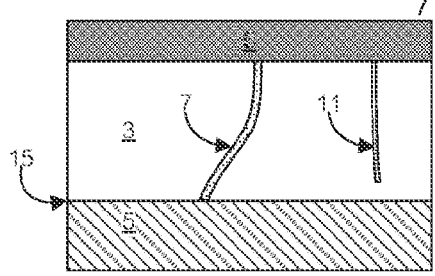
Figure 1C:
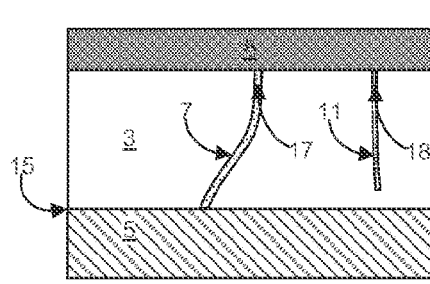
Figure 1D:
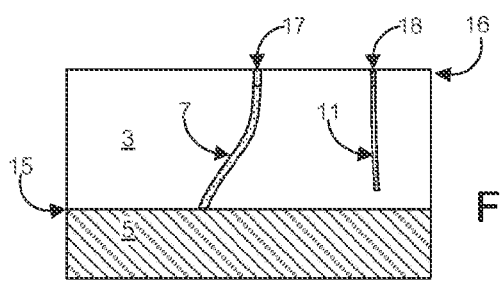
Figure 1E:
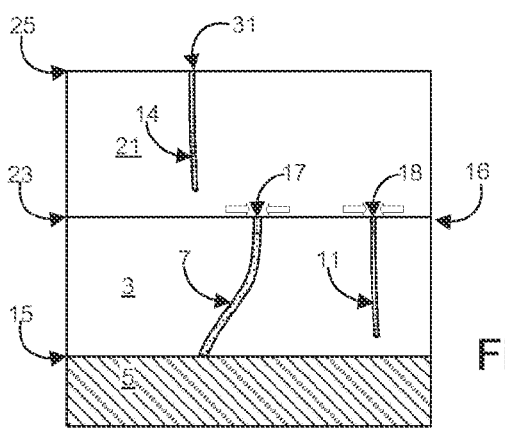

As so understood, FIG. 1A illustrates an initial Group III-nitride semiconductor layer that has been epitaxially grown (or otherwise placed or transferred) on a substrate and that has defects or dislocations emerging and present at its surface. FIGS. 1B and 1C illustrate a preferred embodiment of this invention which begins by forming a protective layer (comprising a protective material) on the surface of the initial Group III-nitride layer (FIG. 1B), and then by thermally treating the Group III-nitride layer with the protective layer (FIG. 1C). The thermal treatment is controlled so as to promote selective reactions that produce regions of amorphous complex material. Next, FIG. 1D illustrates that the surface layer of protective material is then removed under conditions that substantially prevent removal of both the defect free portions of the Group III-nitride surface and also the regions of amorphous complex material. Finally, FIG. 1E illustrates subsequent epitaxial growth of a following layer on the surface of the initial layer (with the amorphous complex regions where surface defects or dislocations were present in the initial layer) during which the following layer, at least initially, grows laterally over the amorphous complex regions. The amorphous complex regions are thereby covered and buried with a following layer that is free or substantially free of defects propagating from the amorphous complex regions.

In more detail, FIG. 1A illustrates an initial Group III-nitride semiconductor layer 3 grown on substrate 5 during an epitaxial process (or otherwise placed on substrate 5, e.g., by layer transfer). Alternatively, the combination of layers 3 and 5 could comprise a single Group-III material, e.g., comprising a single, free standing layer of GaN. Defects or dislocations 7 can arise at interface 15 between the initial layer and the substrate, often because, the crystal properties (and other physical properties) of the initial material do not sufficiently closely match those of the material of substrate 5 (or substrate on which layer 3 is grown). These defects and dislocations can continue (or "propagate") along with the growing material into initial Group III-nitride layer 3 and emerge at surface 16, resulting in surface defects. For example, defect/dislocation 7 in the bulk of material 3 terminates as surface defect 9. In the specific case of gallium nitride, defects and dislocations 7, most commonly threading dislocations (TD), can be numerous in layers epitaxially grown on sapphire substrates. Defects and dislocations, e.g., defect or dislocation 11, can also arise in the bulk of the growing semiconductor material and continue or propagate along with the growing layer to emerge as surface defects, e.g., surface defect 13, of the initial Group III-nitride semiconductor layer surface 16.

FIG. 1B illustrates the further step of the invention that prepares the surface of initial Group III-nitride layer 3 for the subsequent epitaxial deposition of a following layer (illustrated in FIG. 1E) by sealing (or covering or burying) most or all of the surface emergent defects with regions of amorphous complex material produced by the interaction of protective layer 6, comprising a protective material, with surface emergent defects (providing seals over the surface defected regions). First, a selected protective material is spun, or deposited, or placed, or the like across surface 16 so that the defected surface is fully, or substantially fully, covered, e.g., so that the protective layer is in intimate contact with the surface defects of the initial gallium nitride layer.

Materials for the protective layer are preferably selected such that, after interaction with surface defects of the initial Group III-nitride layer, the resulting regions of amorphous complex material are such as to promote lateral overgrowth of the following layer. For example, the material of the following Group III-nitride layer (the following Group III-nitride material) should not readily nucleate on, or grow directly, on the regions of amorphous complex material (at least in comparison to the growth rate on the initial Group III-nitride material), so that the following layer epitaxially laterally overgrows all or substantially all of the regions of amorphous complex material. Growth directly on the amorphized complex regions may induce defects in the following layer. Preferred protective materials are selected in view of the above.

First, a preferred protective material can be selected on the basis of the amorphous complex product produced via the interaction between the protective layer and surface defects and the ability of such an amorphous complex product to promote subsequent growth of the following Group III-nitride material by epitaxial lateral overgrowth. Second, a preferred protective material can be selected to have properties sufficient to prevent significant degradation of the initial Group III-nitride surface during the thermal process cycle(s) required to promote the formation of the regions of amorphous material.

Generally, preferred protective materials comprise silicon. Examples of preferred protective materials include amorphous silicon, amorphous silicon nitrides, amorphous silicon carbides, amorphous silicon oxides, mixtures thereof, and other like silicon containing compounds. Also, if two or more masking materials that encourage ELO are available, the preferred choice among them is that one which is easiest to remove in the subsequent removal step. In most embodiments, it is convenient to epitaxially deposit protective material 6, in which case it is preferable that the epitaxial process used for depositing the protective material be compatible with the epitaxial process used to deposit the Group III-nitride material. For example, if the following layer is deposited by a vapor phase epitaxy (VPE) in a certain reactor, it is preferable that the masking material also be deposited by a VPE process in the same reactor. In certain embodiments the protective layer may be deposited ex-situ in a reactor not utilized for the deposition of the following layer or in other equipment. For example, the masking layer can be deposited by ex-situ methods including physical vapor deposition (e.g. evaporative deposition, sputter deposition etc) and spin coating methods etc.

Figure 2:
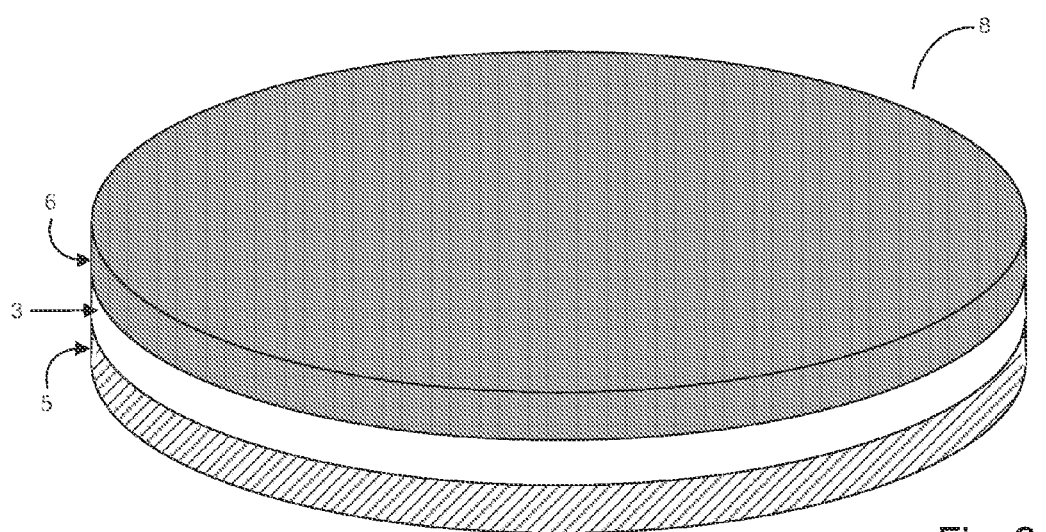
FIG. 2 schematic illustrate a structure of an embodiment of the invention.

FIG. 2 illustrates resulting structure 8 in FIG. 1B in more detail. Again, it should be understood that this figure is schematic in nature and therefore not to scale (in particular, the relative thicknesses of the individual layers are not necessarily representative of an actual semiconductor structure of this invention, and the shape of this structure need not be circular). Protective layer can be formed by epitaxially depositing, or otherwise placing (e.g., by a mechanical process) a protective material so as to be, preferably, fully in contact with most or all of the top surface of the initial Group III-nitride layer. The protective layer is preferably formed to substantially cover the majority of the Group III-nitride layer, resulting in an enveloping of the majority of the initial Group III-nitride surface, as shown schematically in FIG. 2. Also, the protective layer is preferably formed so that the bottom surface of protective layer 6 preferably conforms to the top surface of Group III-nitride layer 3, that is these surfaces are in contact without gap over most of all of their interface (alternatively, is conformal to topography of the surface of layer 3). The close contact between the surface of the initial semiconductor layer and the protective layer ensures that all or a considerable number of the surface defects of the initial layer are in intimate contact with the material of the protective layer, thereby a majority of the surface defects of the initial Group III-nitride layer can interact with protective material during the subsequent thermal treatment. In addition the close contact of the protective layer with the surface of Group III-nitride layer ensures that the surface of the Group III-nitride film does not undergo significant deterioration during subsequent thermal processes.

FIG. 1C illustrates a further step of the invention that thermally treats a structure comprising a protective layer, such as one produced according to FIG. 1B, in, e.g., a furnace, by a laser, or with rapid thermal annealing, etc, thereby forming amorphous complex material at the surface emergent defects (such as surface defects due to emergence of defects or dislocations from the bulk of the initial layer). In FIG. 1C, amorphous complex regions 17 and 18 at the surface emergence of defects of dislocations 7 and 11, respectively, are illustrated by a change in texture from the texture of the defect in the bulk. A preferred thermal process comprises a high temperature annealing process. The annealing process can be performed in a number of apparatus as previously outlined, however in certain example embodiments the high temperature annealing process is performed in-situ, i.e. within the deposition reactor utilized for the formation of the Group III-nitrides and protective materials, etc. For example, if these materials are deposited within a vapour phase epitaxy (VPE) reactor then the high temperature annealing stage could also be performed in such a VPE system. As with previous processes, the use of an in-situ high temperature annealing stage reduces the complexity and the duration of the process.

The temperature and duration of the high temperature annealing process are preferably selected so as to promote interactions between the protective layer and the surface defects of the initial Group III-nitride layer sufficient to form regions of amorphous complex material. Increased temperature promotes interaction between the surface defects of the Group III-nitride semiconductor layer and the protective layer of semiconductor structure 8. The high temperature interaction between the protective layer and the initial Group III-nitride material results in the formation of regions of amorphous complex material. In preferred embodiments, the temperature is selected to be at least about 600° C., or at least about 800° C., or at least about 1000° C.

It is believed, that since the surface regions of the initial Group III-nitride layer located at and proximate to emergent defects have varying degrees of surface disturbance, i.e. the long range order of the crystal structure is disturbed, these more or less disordered or amorphous regions also have a greater propensity for interactions with a protective layer than do the substantially ordered (e.g., crystalline) portions of the crystal surface. The defected surface regions are unlike the ordered portions of the crystal due to a number of physical characteristics including but not limited to dangling bonds, vacancies, excess charge density etc. Therefore, upon heating of the structure it is expected that the disordered portions of the crystal at the interface between the initial material and the protective material will preferentially interact with the protective material. The interaction between the defected regions and the protective material will form regions of amorphous complex material in the locations at and proximate to the regions of the emergent surface defects, which thereby "seal" or "occlude" the defected regions.

However, the temperature and time of the thermal treatment are controlled so that amorphous complex material is not formed in the crystalline surface regions, e.g., the surface regions with long range order. Most preferably, none of the crystalline regions are amorphized. But if necessary, a small amount of amorphization of the crystalline surface (e.g., less than about 5%) can be tolerated in order that nearly all of the surface defects (e.g., greater than about 95% or 99%) are amorphized. Also, the heating parameters and conditions should not be such as to result in the deterioration of the initial Group III-nitride layer. For example, gallium nitride surfaces have been shown to be comparatively stable up to a temperature on the order of approximately 800° C. in various ambient atmospheres, however at higher temperatures and in unfavorable environments surface decomposition has been observed. Therefore, the internal ambient environment of the system utilized for the high temperature annealing process (especially for temperatures of approximately 800° C. or greater), which can influence the stability of the Group III-nitride surface, is selected to comprise gas species capable of maintaining the surface integrity at elevated temperature. For example, the surface of a gallium nitride film can be preserved by heating in an environment containing nitrogen (e.g. ammonia—$NH_3$).

Also, the protective layer, in addition to comprising a source for forming regions of amorphous complex material, can also preferably substantially limit deterioration or decomposition of the Group III-nitride surface during the high temperature thermal process by limiting the vaporization of surface components. To limit or prevent significant reduction in the surface quality of the Group III-nitride layer, the protective layer preferably encapsulates or fully covers the Group III-nitride material surface. The protective layer is also preferably selected to be capable of withstanding the high temperatures for sufficient times to complete the annealing process. For example, silicon carbide, a preferred protective material, has a decomposition temperature of approximately 2700° C. and is therefore capable of withstanding the temperatures required during the thermal process without significant deterioration.

FIG. 1D illustrates a further step of the invention during which the protective layer is removed from the portions of the initial Group III-nitride surface away from the regions of amorphous complex material (e.g., the portions of the surface that are substantially free of significant defects) so that these former portions are exposed for further epitaxial growth, and further so that only the surface defects remain occluded by the regions of amorphous complex material (which typically extend for a short distance (dependent on diffusion coefficient, temperature and time) below the surface). The removal process is preferentially removes the protective layer from the relatively defect/dislocation free regions of the initial Group III-nitride layer whilst substantially leaving regions of amorphous complex material at or proximate to emergent defects/dislocations of the layer. Preferably, such removal does not involve complex processes requiring addition masking layers.

The protective material can be removed by a variety of methods known in the art, including wet chemical etching, plasma etching (e.g. Reactive Ion Etching (RIE), Inductively Coupled Plasma etching), and the like. In the case of plasma etching, preferred etch chemistries selectively etch the protective materials more rapidly than the Group III-nitride materials. For example, fluorine containing plasma species have been commonly utilized for the removal of silicon containing materials such as silicon oxides and nitrides, whilst such chemical species are relatively ineffective in plasma etching Group III-nitride materials. In alternate embodiments the protective material is removed by a polishing process, e.g. by chemical mechanical polishing (CMP). The CMP conditions, in particular the slurry abrasives and chemistry, are preferably chosen as known in the art so that protective material 6 is more readily removed than the Group III-nitride material of layer 3 and the regions of amorphous material.

Preferred removal processes (e.g., RIE or CMP) result in little or no roughening of the initial surface 16. However, if surface roughening occurs, e.g., by the abrasive action during a the CMP process, surface layer 16 can be smoothed. In the case of Group III-nitrides, a roughened surface can be preferably smoothed by mass transport regrowth methods known in the art. For example, the sample is heated in an $NH_3+H_2$ ambient to a temperature that promotes mass transport regrowth. During mass transport regrowth the high energy peaks in the material are redistributed into the valleys of the material resulting in a smoothing action and a surface more suitable for subsequent ELO. See, e.g., Japanese Journal of Applied Physics Part 1 40 565 (2001) and Applied Surface Sciences 159-160 421 (2000).

FIG. 1E illustrates that, once substantially all or all of the surface defects having been sealed (or occluded) by regions of amorphous complex material, following layer 21, e.g., a following Group III-nitride, is epitaxially grown on the surface of the initial Group III-nitride layer. After the above thermal processing, most or all of the surface defects will have been sealed (or occluded) by amorphous complex material, leaving the surface of the initial Group III-nitride layer 3 (surface 16) away from these regions of amorphous complex material relatively free of defects or dislocations (compared to layer 3 as a whole prior to forming the regions of amorphous complex material). The following layer (21 of FIG. 1E) should preferably not nucleate on and should preferably not grow from the regions of amorphous complex material, because this material (like the material of substrate 5) can be expected to induce numerous defects in the following layer.

Instead, the following layer should preferably nucleate on, and grow from, the relatively defect-free portions of initial Group III-nitride surface 16. In more preferred embodiments, the materials of the initial layer and the following layer are selected to be closely similar in, at least, crystallography, so that these defect-free portions of the initial surface will introduce few or no new defects in the following layer. In many embodiments, the following Group III-nitride material of layer 21 is substantially identical to the current material of layer 3, e.g. the growth of gallium nitride (or InGaN, AlGaN) over an initial layer of gallium nitride. In such embodiments, it is preferred that the following material has relevant properties closely similar to those of the initial Group III-nitride material, so that few if any defects will arise at interface 23 between layer 3 of the current material and the following layer 21 of the following material. Thereby, following layer 21 will have better quality, i.e., fewer defects and dislocations, than current layer 3.

Therefore, the following layer should preferably grow up and over the regions of amorphous complex material, but preferably not vertically from the regions of amorphous complex material, i.e. growth should, at least initially, be in an ELO-like (epitaxial lateral overgrowth) manner. Accordingly, the specifics of the defect sealing process, e.g. choice of the protective material and placement of the protective layer (as illustrated in FIGS. 1B-1C) are advantageously selected to promote subsequent ELO-like growth of a following layer over most or all of the regions of amorphous materials. Further, the initial growth depositions conditions are preferably selected to promote ELO as known in the art, see for example Hiramatsu et al Journal of Physics: Condensed Matter 13 6961(2001). These conditions are preferably continued at least until the regions of amorphous complex material have been laterally overgrown and bridged by growing layer 21. Subsequently conditions can be changed to promote routine vertical growth.

Turning to FIG. 1E in more detail, defect 7 does not continue into layer 21 because it has been sealed with region of amorphous complex material 17. Further, the amorphous complex material does not itself cause defects or dislocations in layer 21 because, as the opposed arrows indicate, this layer has grown laterally over amorphous complex region 17. In addition the defect 11 that originates in the bulk of initial Group III-nitride layer 3 also does not continue into layer 21 because it also has been sealed with region of amorphous complex material 18 and overgrown in the same manner as defect 7. However, a few defects or dislocations can originate de novo in the bulk of a growing layer. For illustrative purposes, defect or dislocation 14 is such a new defect or dislocation arising in the bulk of layer 21 and emerging at surface 25 as surface defect 31. In summary and for the reasons explained above, layer 21 has at least fewer, and often significantly fewer, defects and dislocation than layer 3. It should be understood that FIG. 1E is for illustrative purposes only and is not intended to represent the actual performance of this invention.

In further advantageous embodiments, the methods described above can be performed two or more times so that the successive following Group III-nitride layers have successively improved qualities. As an example of such embodiments, FIGS. 3A-E illustrate a second use of these methods on a structure which in turn resulted from a first use of these methods. For purposes of illustration, the methods are demonstrated as being further applied to the structure of FIG. 1E, with defect 14 emerging from following Group III-nitride layer 21 as surface defect 31.

Figure 3A:
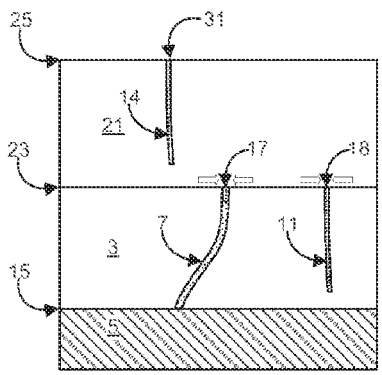
FIGS. 3A-E schematically illustrate a further embodiment of the invention.
Figure 3D:
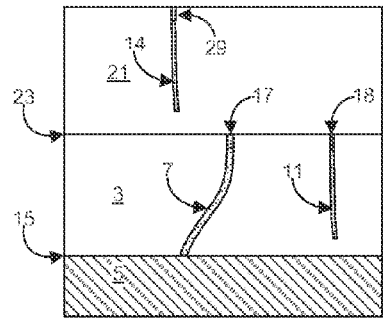

The structure of FIG. 3A is fabricated from the structure of FIG. 1A by application of the embodiments of the invention, i.e. forming a protective layer on the surface of initial semiconductor structure 3 in such away as the protective layer occludes a substantial portion of the surface defects. The structure thus formed 8 is subjected to a thermal cycle to promote interactions between the surface defects and the protective layer resulting in regions of amorphous complex material. The protective layer is then removed by etching, chemical mechanical polishing etc., to expose a surface comprising high quality gallium nitride and regions of amorphous complex material. A following layer of Group III-nitride 21 is then initially laterally grown over the regions of amorphous complex material and then in a more vertical mode until the desired thickness is obtained, thereby producing a following layer of Group III-nitride material with a reduced surface defect density compared with the initial Group III-nitride layer.

Figure 3B:
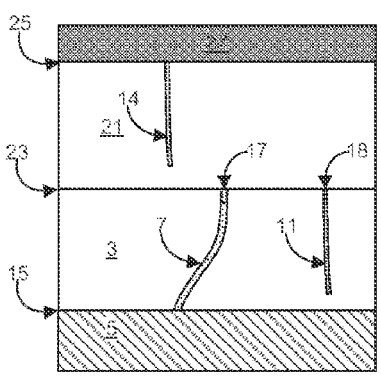

To apply the methods of this invention a second time, steps corresponding to and similar to the steps illustrated in FIGS. 1B-1E are performed on the structure of FIG. 3A. Corresponding to FIG. 1B, FIG. 3B illustrates the formation of protective layer 27 on following Group III-nitride 21, as illustrated the protective layer envelopes the surface of the following layer and substantially occludes the surface defects. A following step, illustrated in FIG. 3C, thermally treats the semiconductor structure in order to promote interactions between protective layer 27 and defect 14. The interactions result in regions of amorphous complex material 29, capable of preventing the propagation of defect 14 into successively following layer 35.

Figure 3E:
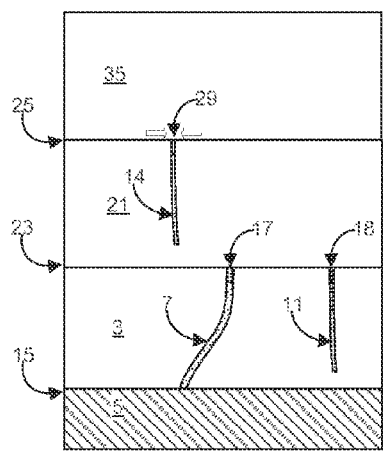
Figure 3C:
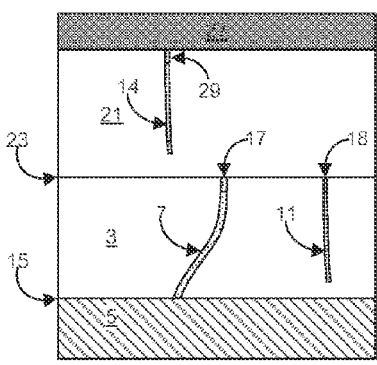

The protective material of the protective layer is then removed via a etching/polishing process (FIG. 3D) to selectively remove protective material from the high quality gallium nitride surface whilst maintaining all or substantially all of the amorphous complex material at or proximate to surface defects in surface 25. The surface of following layer 21 is suitable for epitaxial lateral overgrowth to produce a successive following layer, as illustrated in FIG. 3E. As previously, described the successive following layer is initial grown up and over the regions of amorphous complex material until a continuous layer of material is produced upon coalescence of the separate growth fronts. The growth mode can be altered upon formation of the continuous film to provide a more vertical growth mode desirable for producing films of a preferred thickness 35.

Thereby, the successive following layer 35 will have better quality than the previous following layer 21, which in turn will have better quality than the initial layer 3. Specifically, the densities of defects and dislocations in layer 35 are less than in layer 21, which in turn are less than in layer 3.

The following examples provide exemplary physical parameters, e.g. times, temperatures, ambients, etc., for the steps of this invention. The parameters provided are suitable for use with gallium nitride; for other Group III-nitride materials suitable parameters can be different. Accordingly, it should be understood that the parameter provided are exemplary and illustrative only, and suitable parameters for different materials should be chosen as known in the art.

EXAMPLE 1

A (0001) sapphire substrate is utilized for the growth of gallium nitride layer 3. The substrate can be prepared for gallium nitride growth by preprocessing steps such as a cleaning cycle to remove unwanted contaminants (e.g. a high temperature bake in hydrogen containing ambient), a nitridization of the upper surface of the substrate, and further surface pretreatments dependent on the growth material and substrate.

Next a nucleation layer is deposited on the substrate and gallium nitride layer 3 is grown in a metalorganic chemical vapor deposition (MOCVD) reactor utilizing trimethlygallium (TMG) and ammonia ($NH_3$) as precursor gases. First, the nucleation layer is deposited then thermally treated. Nucleation layer deposition is performed for a period of about 20 min by flowing TMG and $NH_3$ while maintaining the reactor temperature at approximately 500° C. and the pressure at about 300 mb. Next, the nucleation layer is thermally treated by maintaining the reactor pressure at about 300 mb, stopping the flow to TMG but continuing the flow of $NH_3$, and raising the reactor temperature to about 1100° C. for a time period of about 20 mins. Finally, the GaN layer is grown. GaN growth is performed for about 90 minutes, or until reaching a layer thickness of approximately 1.0-2.5 µm, by again flowing both TMG and $NH_3$ while maintaining the reactor temperature at approximately 1100° C. and the pressure at about 300 mb. The resulting gallium nitride surface thus formed typically has many surface defects.

The initial gallium nitride structure (structure of FIG. 1A) is then transferred to a plasma enhanced chemical vapor deposition (PECVD) system (i.e. an ex-situ deposition system) for deposition of the protective layer. The masking material can comprise an amorphous silicon dioxide and is deposited utilizing as precursors silane and nitrous oxide at a pressure of 350 mTorr and a reactor temperature of 300° C. Deposition of the silicon dioxide masking layer is approximately 30 minutes, or until a thickness of least about 500 nm to ensure substantially complete coverage of the surface defects.

The gallium nitride structure with the protective layer (structure of FIG. 1B) is then transferred to a thermal processing system (e.g. a rapid thermal annealer (RTA)) capable of increasing the temperature of the semiconductor structure in a controlled environment, e.g. with a desired gaseous ambient. The structure is heated to a temperature of approximately 800° C., in a flowing ammonia atmosphere, and held at that temperature for approximately 120 seconds. Upon completion of the heating cycle the RTA temperature is reduced, however the rate of temperature decrease is limited to prevent thermal shock and possible damage to the semiconductor structure being treated. It should also be noted the ammonia ambient should be held in place until the temperature of the Group III-nitride structure is sufficiently low such that surface damage is unlikely.

Upon completion of the thermal process the Group III-nitride structure (structure of FIG. 1C), the protective layer is removed to expose a high quality gallium nitride surface including regions of amorphous complex material. Excess protective layer can be removed by chemical mechanical polishing with conditions and parameters selected to remove the silicon dioxide whilst substantially preserving the quality of surface 125 of the gallium nitride and preventing the removal of the regions of amorphous complex material.

The polished structure (structure of FIG. 1D) is then placed in the growth reactor and the temperature and precursor flow parameters for the initial stages of bulk growth are optimized for ELO as known in the art (for example see Hiramatsu et al Journal of Physics: Condensed Matter 13 6961 (2001)), resulting in a 2D growth mode and upon Group III-nitride coalescence into a continuous film the flow parameters are again varied for growth of the remaining bulk GaN material The time period for growth of the GaN layer is dependent on the target thickness required and the sustainability of the reactor process.

The resulting gallium nitride layer, being grown by ELO over the regions of amorphous material, has a defect density less than that of the initial gallium nitride layer. The density of defects in the following layer of Group III-nitride material can be no greater than $5 \times 10^7$ cm$^{-2}$.

EXAMPLE 2

Many aspects of this example are similar to those of Example 1, and reference is made to that example for their description. Only aspects distinct from the previous example will be described.

The initial Group III-nitride layer (structure of FIG. 1A) with surface defects is grown as in Example 1. This structure is not removed from the deposition reactor utilized for deposition.

The temperature of the deposition reactor is then cooled from gallium nitride growth temperature (e.g. about 1100° C.) down to a temperature of approximately 600° C. over a time period of approximately 15 minutes. A protective layer comprising silicon nitride is now grown by introducing silane gas (or alternatively diethylsilane) and ammonia gas (or alternatively hydrazine, or a nitrogen gas vapor generated from a nitrogen based organometallic precursor) the deposition chamber for a growth time period of about 30 minutes and at a growth temperature of approximately 600° C. The thickness of the protective layer can be regulated by the deposition parameters.

With the Group III-nitride semiconductor with the protective layer (structure of FIG. 1B) still remaining in the deposition chamber, precursor gases used for the protective layer are shut-off but an ambient, e.g. a flow of ammonia, is begun or continued for protecting the Group III-nitride material during thermal processing. The internal temperature of the reactor is next increased from about 600° C. to about 800° C. for a time sufficient to promote the formation of amorphous regions of material, e.g. 30 minutes by interaction of the protective layer and the surface defects. The deposition reactor temperature is then cooled for unloading the resulting semiconductor structure (structure of FIG. 1C), at a cooling rate selected to limit or prevent damaging thermal shock.

The protective layer is then removed from the resulting structure as in Example 1.

The resulting structure (structure of FIG. 1D) is then placed back into the deposition reactor, and the following Group III-nitride layer is grown as in Example 1.

The resulting gallium nitride layer (structure of FIG. 1E), being grown by ELO over the regions of amorphous material, has a defect density less than that of the initial gallium nitride layer. The density of defects in the following layer of Group III-nitride material can be no greater than $5 \times 10^7$ cm$^{-2}$.

The preferred embodiments of the invention described above do not limit the scope of the invention, since these embodiments are illustrations of several preferred aspects of the invention. Any equivalent embodiments are intended to be within the scope of this invention. Indeed, various modifications of the invention in addition to those shown and described herein, such as alternate useful combinations of the elements described, will become apparent to those skilled in the art from the subsequent description. Such modifications are also intended to fall within the scope of the appended claims. In the following (and in the application as a whole), headings and legends are used for clarity and convenience only.

What is claimed:

1. A method for growing a following layer of a Group III-nitride material over an initial layer of a Group III-nitride material having a surface comprising a plurality of surface emergent defects, which comprises:
    selectively forming localized regions of an amorphous complex material at the surface of the initial layer of the Group III-nitride material, by
        occluding a plurality of surface defects with a protective layer of protective material, and
        thermally treating the initial layer of the Group III-nitride material with the protective layer of protective material thereon, wherein the protective layer prevents decomposition of the surface of the initial layer of the Group III-nitride material during the thermal treatment and prevents exposure of the initial layer of the Group III-nitride material throughout the heat treatment,
    removing the protective layer after the heat treatment to expose the initial layer of the Group III-nitride material to facilitate growth of the following layer of the Group III-nitride material thereon, and
    epitaxially laterally overgrowing ("ELO") the localized regions of the amorphous complex material with the following layer of the Group III-nitride material.

2. The method of claim 1 wherein a plurality of the localized regions of the amorphous complex material are formed at or proximate to the plurality of surface defects.

3. The method of claim 1 wherein the localized regions of the amorphous complex material substantially prevent propagation of defects from the initial layer of the Group III-nitride material into the following layer of the Group III-nitride material.

4. The method of claim 1 wherein the localized regions of the amorphous complex material substantially prevent nucleation of Group III-nitride semiconductor material thereon.

5. The method of claim 1 wherein the following layer of the Group III-nitride material has a lower surface defect density than the initial layer of the Group III-nitride material.

6. The method of claim 1 wherein the thermal treatment is performed at a temperature of at least 600° C.

7. A method for preventing propagation of a plurality of surface defects from an initial Group III-nitride layer into subsequent Group III-nitride layers which comprises:
    depositing a protective layer of protective material upon the initial Group III-nitride layer, wherein the plurality of the surface defects are occluded with the protective layer, promoting a selective interaction between the plurality of surface defects and the protective layer by thermally treating the initial Group III-nitride semiconductor layer with the protective layer of protective material thereon, wherein the protective layer substantially prevents decomposition of the initial Group III-nitride semiconductor surface during the thermal treatment and prevents exposure of the initial Group III-nitride layer throughout the heat treatment, removing the protective layer after the heat treatment to expose the initial Group III-nitride layer to facilitate growth of a following Group-III nitride layer thereon, and epitaxially depositing the following Group-III nitride layer upon the initial Group III-nitride layer.

8. The method of claim 7 wherein the selective interaction between the plurality of surface defects and the protective layer is promoted in response to a thermal process.

9. The method of claim 7 wherein the steps of depositing the protective layer, promoting the selective interaction between the deposited protective layer and the surface defects of an underlying Group III-nitride layer, the removal of the protective layer, and the deposition of the successive following layer of Group-III nitride material are repeated one or more times, wherein the successive following layer of Group III-nitride material has a successively reduced surface defect density in comparison to the underlying Group III-nitride layer.

10. The method of claim 7 wherein the protective layer comprises an amorphous material.

11. The method of claim 7 wherein the initial Group-III nitride layer includes amorphous complex regions located at or proximate to emergences of defects at an upper surface of the initial Group-III nitride layer, and the following layer of Group-III nitride material overlies the initial Group-III nitride layer so that a lower surface of the following layer of Group-III nitride material is adjacent the upper surface of the initial Group-III nitride layer.

12. The structure of claim 11 wherein the following layer of Group III-nitride semiconductor material has a surface defect density that is less than a surface defect density of the initial Group III-nitride semiconductor layer.

13. The method of claim 11 wherein the amorphous complex regions comprise one or more of silicon, nitrogen, and a Group III metal.

14. The method of claim 11 which further comprises providing one or more additional Group III-nitride semiconductor layers upon the following layer of Group-III nitride material.

15. The method of claim 14 wherein each additional layer has an upper surface including amorphous complex regions located at or proximate to the emergences of defects at the upper surface, and wherein each additional layer overlies a respective lower Group III-nitride layer so that a lower surface of each additional layer is adjacent to an upper surface of the respective lower Group III-nitride semiconductor layer.

16. The method of claim 15 wherein the additional Group III-nitride semiconductor layers include amorphous complex regions adjacent to one another.

17. A method for growing a following layer of a Group III-nitride material over an initial layer of a Group III-nitride material having a surface comprising a plurality of surface emergent defects, which comprises:

selectively forming localized regions of an amorphous complex material at the surface of the initial layer of the Group III-nitride material, by
    occluding a plurality of surface defects with a protective layer of protective material, and
    thermally treating the initial layer of the Group III-nitride material with the protective layer of protective material thereon wherein the protective layer prevents decomposition of the surface of the initial layer of the Group III-nitride material during the thermal treatment, and epitaxially laterally overgrowing ("ELO") the localized regions of the amorphous complex material with the following layer of the Group III-nitride material, wherein the protective layer is removed utilizing a chemical mechanical polishing process or a plasma etching process or both, and conducting a smoothing process performed after the removal of the protective layer.

* * * * *